United States Patent [19]

Rickard

[11] Patent Number: 4,756,006
[45] Date of Patent: Jul. 5, 1988

[54] BUS TRANSCEIVER

[75] Inventor: Dale A. Rickard, Manassas, Va.

[73] Assignee: International Business Machines Corporation, Armonk, N.Y.

[21] Appl. No.: 832,942

[22] Filed: Feb. 26, 1986

[51] Int. Cl.⁴ .................................. H03K 17/693
[52] U.S. Cl. .................................. 375/7; 375/36; 307/241; 307/473; 307/480
[58] Field of Search .......... 307/473, 480, 241, 272 R, 307/601, 602, 475, 582; 375/7, 36; 178/71 R, 71 N; 370/85, 24, 29, 32

[56] References Cited

U.S. PATENT DOCUMENTS

| | | | |
|---|---|---|---|
| 3,769,525 | 10/1973 | Foss | 307/254 |
| 4,024,501 | 5/1977 | Herring | 375/36 X |
| 4,101,734 | 7/1978 | Dao | 375/17 |
| 4,146,802 | 3/1979 | Moench | 307/279 |
| 4,216,389 | 8/1980 | Carter | 307/247 R |
| 4,315,167 | 2/1982 | Pelc | 307/241 |
| 4,320,521 | 3/1982 | Balakrishnan et al. | 375/36 |
| 4,337,465 | 6/1982 | Spracklen et al. | 340/825.03 |
| 4,388,725 | 6/1983 | Saito et al. | 375/36 |
| 4,446,382 | 5/1984 | Moore et al. | 307/241 |
| 4,471,243 | 9/1984 | Isham | 307/475 |
| 4,488,066 | 12/1984 | Shoji | 307/480 |
| 4,500,988 | 2/1985 | Bennett et al. | 370/85 |
| 4,504,745 | 3/1985 | Spence et al. | 307/473 |
| 4,527,076 | 7/1985 | Matsuo et al. | 307/473 |
| 4,531,068 | 7/1985 | Kraft et al. | 307/473 |
| 4,614,882 | 9/1986 | Parker et al. | 307/475 |
| 4,617,476 | 10/1986 | Dalrymple | 307/601 |
| 4,680,487 | 7/1987 | Kobayashi | 307/475 |
| 4,697,107 | 9/1987 | Haines | 307/475 |

Primary Examiner—Benedict V. Safourek
Attorney, Agent, or Firm—H. St. Julian; John E. Hoel

[57] ABSTRACT

A data signal appearing at an input node of a bus transceiver is transmitted to an output node thereof during a clock cycle. During a second phase of the clock cycle, the data signal is captured in a latch of the transceiver and continues to be transmitted to the output node. Additionally, a receiver is enabled to the detect the transmitted data signal at the output node and to transmit the detected data signal to the input node. Thereafter, the detected data signal can be sensed by an external circuit.

2 Claims, 3 Drawing Sheets

BUS TRANSCEIVER

DESCRIPTION

1. Technical Field

The invention disclosed broadly relates to electrical circuits and more particularly to a circuit for transmitting a signal appearing on an input line to a bus and for sensing the value of the transmitted signal over the input line during a single bus cycle.

2. Background of the Invention

An output from a digital circuit may have to be re-driven to convert the signal from one logic family's electrical standard to another or to improve the drive capability of the chip. Additionally, the re-driven signal may need to be sensed by the digital circuit in order to determine if the signal is correct or to observe the result of a wired-or (or wired-and) logic performed with the re-driven signal. With the development of very large scale integrated circuits, the number of circuit modules on a single chip has increased while the number of pins which are available for input and output (I/O) has remained constant. Moreover, in multiprocessor system environments, there is a need to have I/O nodes at which a plurality of functions can be performed. In reference to known bus transceivers, an I/O set is associated with a driver circuit and a separate I/O set is associated with a receiver circuit. Thus, the digital chip requires multiple pins to drive and sense through the transceiver. Additionally, in order to sense the data transmitted by the transceiver to a bus, the chip may require the use of special timing signals and may require a plurality of bus cycles.

Consequently, a bus transceiver is needed which transmits a signal generated by an external source onto a bus while allowing the external source to sense the value of the transmitted signal over the same signal line used to supply the original signal. Moreover, the transmission of the signal and the sensing thereof should take place during a single bus cycle without using any special timing signals.

OBJECTS OF THE INVENTION

It is therefore an object of the invention to provide an improved data bus transceiver.

It is another object of the invention to provide an improved data bus transceiver which transmits a data signal to a data bus and senses the transmitted data signal during a single clock cycle.

It is a further object of the invention to provide an improved data bus transceiver which allows a data signal to be transmitted and sensed using a single line from a source circuit.

It is still another object of the invention to provide an improved data bus transceiver which converts a data signal from the electrical standard of a first logic family to the electrical standard of a second logic family.

SUMMARY OF THE INVENTION

These and other objects, features, and advantages of the invention are accomplished by the data bus transceiver disclosed herein. The bus transceiver includes a latch means for transmitting data signals received over an input line to a data bus during a single clock cycle, means, coupled to the latch means, for buffering the transmitted data signals and means, coupled to the data bus, for sensing the levels of the transmitted data signals. The latch means captures the data signals therein at the end of a first half of the clock cycle while continuing to transmit the data signal to the data bus. The sensing means detects the transmitted data signals on the data bus during a second half of the clock cycle and feeds the detected data signals to the input line for subsequent detection thereon by a external circuit.

BRIEF DESCRIPTION OF THE DRAWINGS

The foregoing and other advantages of the invention will be more fully understood with reference to the description of the best mode and the drawings wherein.

DESCRIPTION OF THE PREFERRED EMBODIMENT

Figure 1:
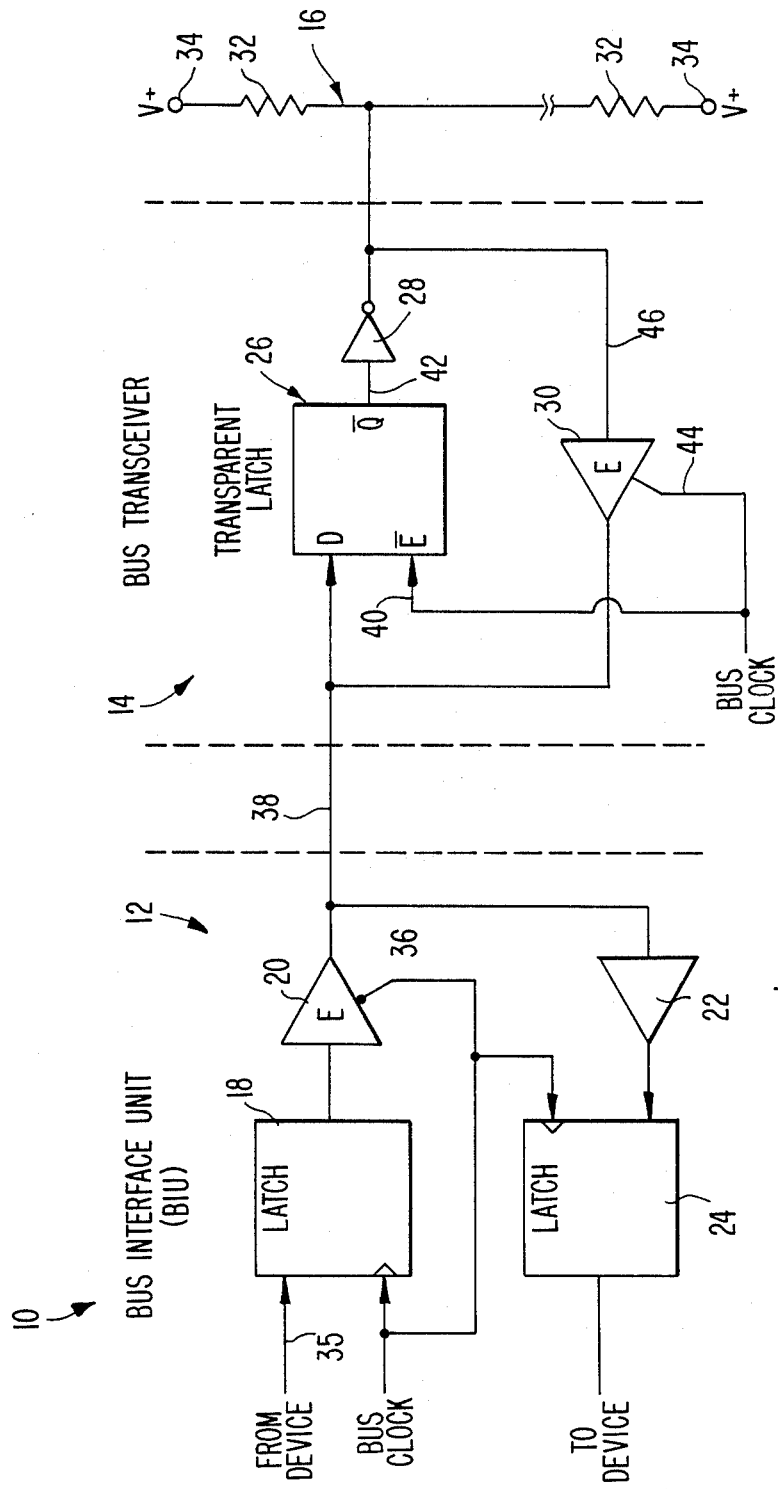
FIG. 1 is a block diagram of a bus system in accordance with certain principles of the invention.

Referring to FIG. 1, a bus system 10 includes a bus interface unit (BIU) 12, a bus transceiver 14 and a wired-or bus 16. The BIU 12 includes a output latch 18, an output driver 20, a receiver 22, and an input latch 24. Moreover, the BIU 12 is a circuit having limited input-/output (I/O) capability which requires the circuit to generate signals over and to detect the generated signals utilizing the same line. The bus transceiver 14 includes a transparent latch 26, an isolation device, such as an inverting open-collector, an open-drain or a tri-state buffer 28, and a sense receiver 30, which may also be an open-collector, an open-drain or a tri-state device. The bus 16 is represented by a backplane transmission line which is terminated at each end thereof with a resistor 32 and a positive voltage source 34. A plurality of bus interface units 12 may be coupled to the bus 16 through associated bus transceivers 14.

Figure 2:
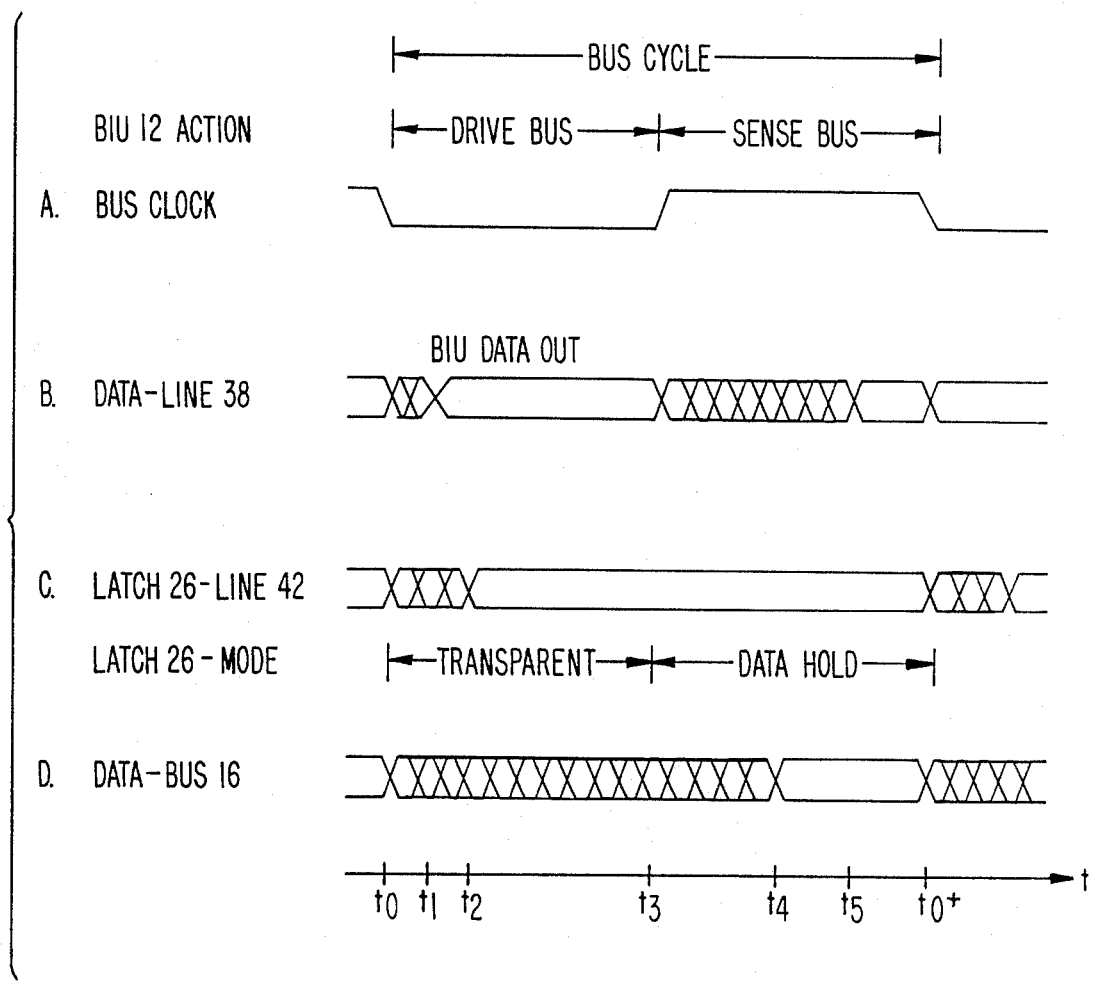
FIG. 2 is an illustration of a plurality of waveforms associated with the bus system of FIG. 1.

Referring to FIGS. 1 and 2, the operation of the bus system 10 is controlled by a bus clock which is shown as waveform A. Data, which is generated by a device (not shown) associated with the BIU 12 and appearing on line 35, is captured in the output latch 18 in response to a low-to-high transition of the bus clock. The output driver 20 is enabled by a high-to-low transition of the bus clock which is fed to an active-low enable input 36 and which permits the data captured in the latch 18 to propagate over line 38 to an input of the transparent latch 26. Thus, data, which is loaded into the output latch 18 on the low-to-high transition of the bus clock, is transmitted to the transparent latch 26 at time $t_1$ as shown in waveform B.

The bus clock, waveform A, also controls the operation of the transparent latch 26 and the sense receiver 30. At time $t_0$ of the bus clock, a low-level signal is fed to an active-low input 40 of the latch 26 and an active-high input 44 of the sense receiver 30. The low-level signal appearing on input 40 facilitates a transparent operation of the latch 26. Thus, data appearing on line 38 at time $t_1$, appears on output line 42 of the latch 26 at $t_2$ as shown in waveform C. The time period between $t_0$, when the transmission of data to the latch 26 is being initiated and $t_2$, when the data appears on the output line 42, is due to a propagation delay of the bus system 10. Data appearing on output line 42 of the latch 26 propagates immediately through the inverting buffer 28 and onto the bus 16 as shown in waveform D. The data on the bus 16 between time periods $t_2$ and $t_4$, is unstable due to the transmission line effects of the backplane transmission line bus.

At the midpoint of the bus cycle, time $t_3$, the bus clock changes from a low-level to a high-level. This low-to-high transition facilitates the (1) disabling of the output driver 20, (2) latching of the valid data into latch 26 and (3) enabling of the sense receiver 30. At time $t_3$, the output driver 20 is disabled from providing data onto line 38. However, the data is captured in the latch 26 and continues to propagate through the inverting buffer 28 and onto the bus 16. Data appearing on the bus 16 between time periods $t_2$ and $t_4$ may require significant settling time as a result of wire-oring with data from other sources (not shown), or as a result of transmission line effects of the bus. Thereafter, the state of the bus 16, which is detected by the bus transceiver 14, propagates over line 46 through the enabled sense receiver 30, over line 38, through receiver 22 and is captured in input latch 24 on the next high-to-low transition of the bus clock at time $t_{0+}$.

Data appearing on line 38 between time periods $t_3$ and $t_5$ may be unstable as a result of instability in the data on bus 16 and the propagation delay of the sense receiver 30. At time $t_5$, the only data appearing on line 38 is the data which is propagating from the sense receiver 30. This data is captured in latch 24 when the bus clock goes to a low-level at time $t_{0+}$.

Figure 3:
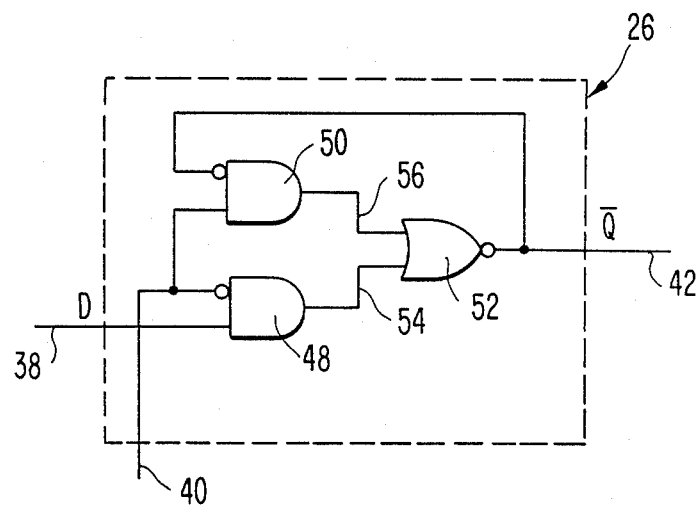
FIG. 3 is a detailed schematic of a transparent latch associated with the bus system of FIG. 1.

Referring to FIG. 3, a detailed schematic of the transparent latch 26 is shown therein. During a first phase of the bus cycle, between time periods $t_0$ and $t_3$, the bus clock is a low-level signal as shown in waveform A. Thus, the low-level signal appears on the active-low input 40 of the latch 26. This low-level signal is fed to an inverting input of AND gate 48 and a non-inverting input of AND gate 50. This low-level signal enables AND gate 48 while disabling AND gate 50. Data, which is propagating from the output driver 20 over line 38, propagates through AND gate 48 over line 54 to an input of NOR gate 52. Since AND gate 50 is disabled, its output signal appearing on line 56 is a binary zero, which facilitates an inversion of the data appearing on line 54. The inverted data signals then propagate onto output line 42. As noted above, this phase of operation of the latch 26 is referred to as the transparent mode.

Subsequently, at time $t_3$ and during a second phase of the bus cycle, the bus clock goes to a high-level signal. This high-level signal disables AND gate 48 and enables AND gate 50. Thereafter, data appearing on line 38 will not propagate through AND gate 48. However, the data, which appears on output line 42, is fed to an inverting input of AND gate 50. This data then propagates through AND gate 50 over line 56 to an input of the NOR gate 52. Since AND gate 48 is disabled, its output signal appearing on line 54 is a binary zero which facilitates an inversion of the data appearing on line 56. The inverted data then propagates onto output line 42 for the remaining portion of the bus cycle. This phase of operation of the latch 26 is referred to as a data hold mode.

Figure 4:
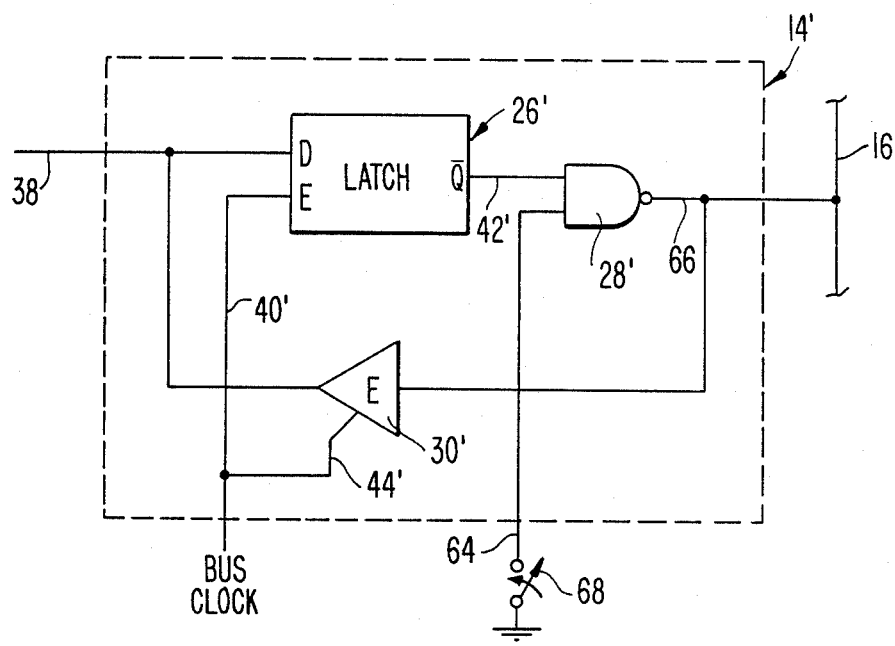
FIGS. 4 and 5 are ultimate embodiments of the bus transceiver associated with the bus system of FIG. 1.

Referring to FIG. 4, there is shown a first alternate embodiment of the transceiver 14. The transceiver 14' includes a transparent latch 26', which is similar to latch 26, an isolation device 28', and a sense receiver 30'. The isolation device 28', such as open-collector, open-drain or tri-state device, includes a control input 64. If, during the operation of the transceiver 14', it becomes necessary to isolate the transceiver from the bus 16, a low-level signal is applied to the control input 64, which enables the output 66 to go to a high or off state. This low-level signal may be provided, for example, by closing a switch 68 in order to connect ground potential to the control input 64. The high or off state of the output 66 will remain in that state irrespective of the data being propagated from the BIU 12. Otherwise, the operation of the transceiver 14' is similar to the operation of the transceiver 14 described above.

Figure 5:
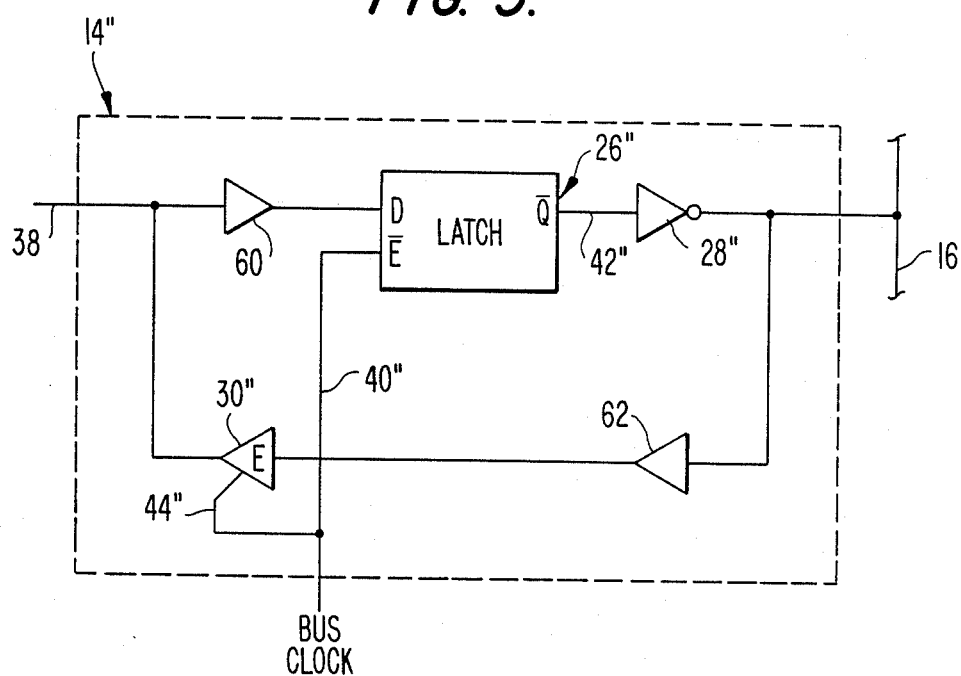

Referring to FIG. 5, there is shown a second alternate embodiment of the transceiver 14. The transceiver 14" includes an input receiver 60, a transparent latch 26", which is similar to latch 26, an inverting buffer 28", a sense receiver 62, and an output driver 30", which is similar to the sense receiver 30 of FIG. 1. The operation of the transceiver 14' is similar to the operation of the transceiver 14 described above, with the addition of input receiver 60 and sense receiver 62 which serve as buffers for data propagating from output driver 20 (FIG. 1) and the bus 16, respectively.

In conclusion, the transparent latch 26 transmits a data signal appearing at an input node through the isolation device 28 during the first phase and the second phase of the bus cycle. At the beginning of the second phase of the bus cycle, the data signal is captured in the latch 26 and continues to be transmitted to the output node. Additionally, the sense receiver 30 is enabled to detect the transmitted data signal appearing at the output node and to transmit this detected data signal to the input node. Thus, the present invention allows an external signal source, such as BIU 12 to transmit a signal over a line to the bus 16 during substantially the full period of the bus cycle and to sense the transmitted signal on the same line during a single cycle of the bus clock.

What is claimed is:

1. An interface circuit for coupling a data port of a device to a data bus, to enable the device to output a data signal to said bus during a first interval and sense the status of said data signal on said bus during a second interval, comprising:

an output latch having a data input connected to said data port of said device, a clock input connected to a clock source which provides a periodic clocking signal with each period thereof being divided into said first interval and said second interval, said output latch having a data output, for latching a data signal at said data input thereof when the clock signal at said clock input thereof has a low-to-high transition;

an output driver having a data input connected to said data output of said output latch, a data output node, and a clock input connected to said clocking source, for transmitting a data signal present at said data input thereof to said data output thereof when said clocking signal at said clock input thereof has as high-to-low transition;

a transparent latch having a data input connected to the data output of said output driver, a clock input connected to said clock signal source, and a data output, for transmitting a data signal at said data input thereof to said data output thereof during said first interval defined to start at said high-to-low transition of said clock signal and to end at the next low-to-high transition of said clock signal;

an inverting isolation device having a data input connected to said data output of said transparent latch and a data output, for inverting the signal output from said transparent latch, said output of said inverting isolation device being connected to said data bus;

said data signal applied to said data input of said output latch being transmitted through said output driver, through said transparent latch and through said inverting isolation device to said data bus during said first interval;

a sense receiver having a data input connected to said data bus, a data output connected to said data output node of said output driver, and a clock input connected to said clock signal source, for transmitting the signal condition of said data bus from said data input thereof to said data output thereof during said second interval defined to start when said clock signal low-to-high transition occurs and which continues until the next high-to-low transition of said clock signal takes place;

said output driver preventing signal passage between its data input and its data output thereof during said second interval;

an input latch having a data input connected to said output node of said output driver, a data output connected to said data port of said device, and a clock input connected to said clock signal source, for receiving said signal condition transmitted during said second interval through said sense receiver from said data bus, and latching said signal condition of said data bus when said clock signal has a high-to-low transition at the end of said second interval;

whereby said device can transmit said data signal to said data bus during said first interval and can receive the signal condition of said data bus during said second interval.

2. An interface circuit for coupling a data port of a device to a data bus, to enable the device to output a data signal to said bus during a first interval and sense the status of said data signal on said bus during a second interval, comprising:

an output latch having a data input connected to said data port of said device, a clock input connected to a clock source which provides a periodic clocking signal with each period thereof being divided into said first interval and said second interval, said output latch having a data output, for latching a data signal at said data input thereof when the clock signal at said clock input thereof has a first-to-second level transition;

an output driver having a data input connected to said data output of said output latch, a data output node, and a clock input connected to said clocking source, for transmitting a data signal present at said data input thereof to said data output thereof when said clocking signal at said clock input thereof has a second-to-first level transition;

a transparent latch having a data input connected to the data output of said output driver, a clock input connected to said clock signal source, and a data output, for transmitting a data signal at said data input thereof to said data output thereof during said first interval defined to start at said second-to-first level transition of said clock signal and to end at the next first-to-second level transition of said clock signal;

an inverting isolation device having a data input connected to said data output of said transparent latch and a data output, for inverting the signal output from said transparent latch, said output of said inverting isolation device being connected to said data bus;

said data signal applied to said data input of said output latch being transmitted through said output driver, through said transparent latch and through said inverting isolation device to said data bus during said first interval;

a sense receiver having a data input connected to said data bus, a data output connected to said data output node of said output driver, and a clock input connected to said clock signal source, for transmitting the signal condition of said data bus from said data input thereof to said data output thereof during said second interval defined to start when said clock signal first-to-second level transition occurs and which continues until the next second-to-first level transition of said clock signal takes place;

said output driver preventing signal passage between its data input and its data output thereof during said second interval;

an input latch having a data input connected to said output node of said output driver, a data output connected to said data port of said device, and a clock input connected to said clock signal source, for receiving said signal condition transmitted during said second interval through said sense receiver from said data bus, and latching said signal condition of said data bus when said clock signal has a second-to-first level transition at the end of said second interval;

whereby said device can transmit said data signal to said data bus during said first interval and can receive the signal condition of said data bus during said second interval.

* * * * *